US012630764B2

(12) United States Patent
Woo et al.

(10) Patent No.: US 12,630,764 B2
(45) Date of Patent: May 19, 2026

(54) ETCHANT COMPOSITION FOR ETCHING SILICON AND SILICON GERMANIUM, AND PREPARATION METHOD OF PATTERN USING THE SAME

(71) Applicant: Samsung Electronics Co., Ltd., Suwon-si (KR)

(72) Inventors: Heesuk Woo, Suwon-si (KR); Kyusang Ahn, Iksan-si (KR); Jung-Min Oh, Suwon-si (KR); Jiwon Kim, Iksan-si (KR); Jinkyu Roh, Iksan-si (KR); Hyojoong Yoon, Iksan-si (KR); Sang Won Bae, Suwon-si (KR); Kyungmo Sung, Suwon-si (KR)

(73) Assignees: Samsung Electronics Co., Ltd., Gyeonggi-do (KR); DONGWOO FINE-CHEM CO., LTD., Jeollabuk-do (KR)

( * ) Notice: Subject to any disclaimer, the term of this patent is extended or adjusted under 35 U.S.C. 154(b) by 164 days.

(21) Appl. No.: 18/354,055

(22) Filed: Jul. 18, 2023

(65) Prior Publication Data

US 2024/0263072 A1 Aug. 8, 2024

(30) Foreign Application Priority Data

Jan. 31, 2023 (KR) ........................ 10-2023-0013216

(51) Int. Cl.
*C09K 13/08* (2006.01)
*H01L 21/306* (2006.01)

(52) U.S. Cl.
CPC ........ *C09K 13/08* (2013.01); *H01L 21/30604* (2013.01)

(58) Field of Classification Search
None
See application file for complete search history.

(56) References Cited

U.S. PATENT DOCUMENTS 10,957,547 B2 3/2021 Bilodeau et al.
12,110,435 B2 * 10/2024 Ge .................... H01L 21/31111
2016/0053386 A1 2/2016 Mizutani et al.
2019/0016999 A1 1/2019 Sakamuri et al.
2019/0103282 A1 4/2019 Ge et al.
2019/0276739 A1 * 9/2019 Liu .................. H01L 21/30604
2020/0079999 A1 * 3/2020 Kim .................. H01L 21/32134
2020/0211856 A1 * 7/2020 Wada ..................... C09K 13/08
2021/0104411 A1 * 4/2021 Chung .............. H01L 21/30604
(Continued)

FOREIGN PATENT DOCUMENTS

CN 102838994 A 12/2012
CN 103668210 A 3/2014
(Continued)

*Primary Examiner* — Shamim Ahmed
(74) *Attorney, Agent, or Firm* — HARNESS, DICKEY & PIERCE, P.L.C.

(57) ABSTRACT

The present disclosure relates to an etchant composition for etching silicon and silicon germanium, and/or a preparation method of a pattern using the etchant composition. The etchant composition may include an oxidizing agent, a fluorine-based compound, a surfactant represented by Chemical Formula 1 or 2, and water. The etchant composition may include the surfactant in an amount of 5% to 40% by weight based on 100% by weight of the etchant composition.

18 Claims, 1 Drawing Sheet

(56) References Cited

U.S. PATENT DOCUMENTS

| | | | | |
|---|---|---|---|---|
| 2022/0081616 | A1* | 3/2022 | Bjelopavlic | B01J 27/16 |
| 2023/0420266 | A1* | 12/2023 | Shigenoi | H01L 21/32134 |

FOREIGN PATENT DOCUMENTS

| | | | |
|---|---|---|---|
| CN | 109554762 | A | 4/2019 |
| KR | 2015/0053212 | A | 5/2015 |
| KR | 101812085 | B1 | 12/2017 |
| KR | 2018/0029080 | A | 3/2018 |
| KR | 2018/0109521 | A | 10/2018 |
| KR | 2019/0122832 | A | 10/2019 |
| KR | 2020/0042900 | A | 4/2020 |
| KR | 102352628 | B1 | 1/2022 |
| KR | 102379074 | B1 | 3/2022 |
| KR | 2022/0081549 | A | 6/2022 |

* cited by examiner

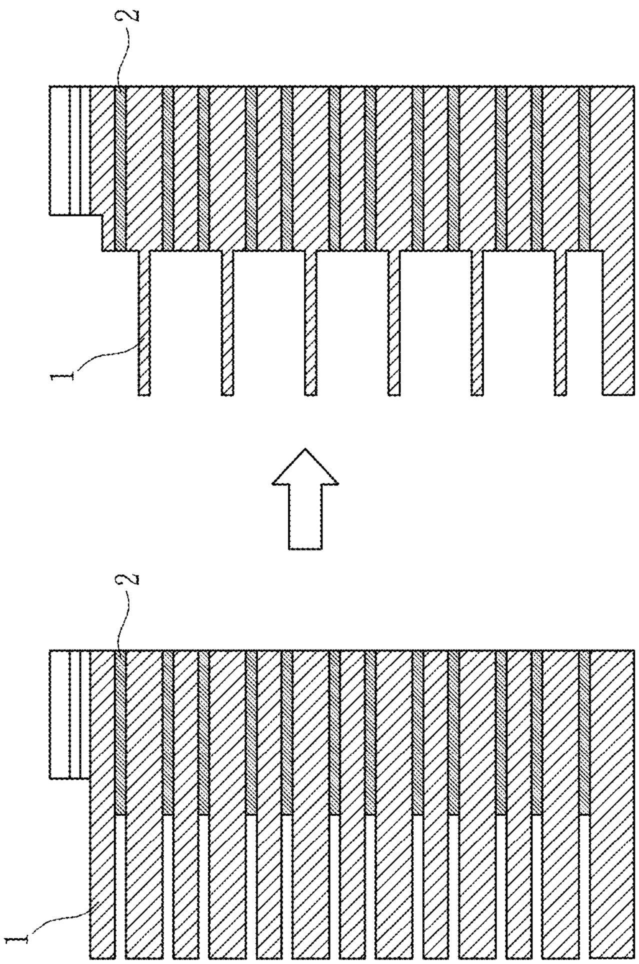
2
1
2
1

ETCHANT COMPOSITION FOR ETCHING SILICON AND SILICON GERMANIUM, AND PREPARATION METHOD OF PATTERN USING THE SAME

CROSS-REFERENCE TO RELATED APPLICATION

This application claims priority to and the benefit of Korean Patent Application No. 10-2023-0013216 filed in the Korean Intellectual Property Office on Jan. 31, 2023, the entire contents of which are incorporated herein by reference.

BACKGROUND

1. Field

The present disclosure relates to an etchant composition for etching silicon and silicon germanium, and/or a preparation method of a pattern using the same.

2. Description of the Related Art

Recently, in a rapidly growing information society, with the development of various technologies, semiconductor devices have been highly integrated in order to process a large amount of information more quickly. Therefore, in order to form more patterns on a semiconductor substrate, pattern spacing and pattern width tend to be narrowed. In particular, as a design rule of a semiconductor device is reduced to 100 nm or less, the space in which a pattern may be formed has become further narrow.

In this way, while a size of the pattern has decreased, electron mobility may be very important in order to drive a highly integrated semiconductor device. In addition, when a leakage current is leaked from a source/drain region formed on the semiconductor substrate to a lower portion of the substrate, a significant amount of current may be leaked through the entire semiconductor device, thereby lowering an operation speed of the semiconductor device as a whole.

Therefore, an effort is being made to limit and/or prevent a current leaked to a lower portion by burying an insulating film in the semiconductor substrate. The buried insulating film is present below an active region of the substrate to limit and/or prevent electrons from moving to a lower portion when a channel is formed in an actual semiconductor device and electrons move in a source/drain region. The substrate having the buried insulating film is formed by forming a buried insulating film on a silicon wafer and growing silicon again on the buried insulating film. In general, silicon germanium is used as the buried insulating film.

When a silicon nitride film or a silicon oxide film is formed on a silicon wafer made of single crystal silicon, silicon germanium is used because single crystal silicon may not be grown again thereafter.

As an example, an epi-stack may be formed of alternating silicon (Si) and silicon germanium (SiGe) layers, where the SiGe layer is a sacrificial layer and the Si layer is a channel layer. The SiGe layer may then be selectively etched and removed (e.g., through a wet etching process such as a hydrogen peroxide solution), and the Si layer may then be formed into nanowire channels suspended over a trench.

Meanwhile, in semiconductor devices such as DRAM and NAND flash memory devices, recently, the development to implement large capacity has been continued while a critical dimension (CD) has decreased sharply.

In the semiconductor device, for example, a silicon-based film or pattern has been widely used as a material for a gate electrode, a capacitor electrode, a conductive contact, wiring, etc. When the gate electrode or wiring is formed through direct etching of a metal film, it is not easy to prepare desired patterns with fine dimensions due to a limitation in etching resolution.

When performing a semiconductor device process having high-reliability, process yield and dimensional reliability may be lowered even by fine impurities and process by-products. Therefore, it may be necessary to develop an etchant composition for improving an etching rate while maintaining etching stability and reliability for preparing patterns with fine dimensions during an etching process of a silicon film.

SUMMARY

Some example embodiments of the present disclosure provide an etchant composition for etching silicon and silicon germanium that has aspects of making a surface uniform after performing etching while etching a silicon film and a silicon germanium film at a desired rate, reducing distribution of patterns due to easy penetration of the composition into micropatterns, and/or not etching a silicon oxide film around single crystal silicon during an etching process.

Some example embodiments of the present disclosure provide a preparation method of a pattern using an etchant composition for etching silicon and silicon germanium.

According to an example embodiment of the present disclosure, an etchant composition for etching silicon and silicon germanium may include an oxidizing agent, a fluorine-based compound, water, and a surfactant represented by the following Chemical Formula 1.

[Chemical Formula 1]

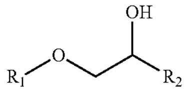

The surfactant may be contained in an amount of 5% to 40% by weight based on 100% by weight of the etchant composition. In Chemical Formula 1, $R_1$ may be an alkyl group having 2 to 4 carbon atoms, and $R_2$ may be hydrogen or an alkyl group having 1 to 3 carbon atoms.

According to an example embodiment of the present disclosure, an etchant composition for etching silicon and silicon germanium may include an oxidizing agent, a fluorine-based compound, water, and a surfactant represented by Chemical Formula 2.

[Chemical Formula 2]

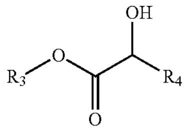

The surfactant may be contained in an amount of 5% to 40% by weight based on 100% by weight of the etchant. In Chemical Formula 2, $R_3$ may be an alkyl group having 2 to 4 carbon atoms, and $R_4$ may be hydrogen or an alkyl group having 1 to 3 carbon atoms.

According to an example embodiment of the present disclosure, a preparation method of a pattern may include: forming a semiconductor device including a silicon layer and a silicon germanium layer; and etching the semiconductor device with the etchant composition for etching silicon and silicon germanium.

BRIEF DESCRIPTION OF THE DRAWINGS

FIG. 1 is a schematic diagram for explaining a preparation method of pattern using an etchant composition for etching silicon and silicon germanium according to an embodiment.

DETAILED DESCRIPTION

Hereinafter, various embodiments of the present disclosure will be described in detail so as to be easily carried out by a person skilled in the art to which the present disclosure pertains. The present disclosure may be implemented in various different forms and is not limited to embodiments described herein.

In addition, it will be understood that when an element such as a layer, a film, a region, or substrate or the like, is referred to as being "on" or "over" another element, it may be "directly on" another element or may have an intervening element present therebetween. To the contrary, it will be understood that when any element is referred to as being "directly on" another element, there are no intervening elements present. In addition, "on" or "over" does not necessarily mean that any element toward the opposite direction of gravity, but means that any element positioned on or below the reference portion.

In addition, throughout the present specification, unless explicitly described to the contrary, the word "comprise" and variations such as "comprises" or "comprising", will be understood to imply the inclusion of stated elements but not the exclusion of any other elements.

Hereinafter, an etchant composition for etching silicon and silicon germanium according to specific embodiments of the present disclosure, and a preparation method of a pattern using the same will be described in more detail.

Unless explicitly stated herein, terminology is used only to refer to specific embodiments and is not intended to limit the present disclosure.

As used herein, the singular forms also include the plural forms unless the phrases clearly dictate the contrary.

Also, the terms including ordinal numbers such as "first" and "second" as used herein are used for the purpose of distinguishing one component from another component, and are not limited by the ordinal number. For example, a first component may also be named a second component, and a second component may similarly be named a first component within the scope of the present disclosure.

In this specification, examples of substituents are described below, but are not limited thereto.

The term "substitution" as used herein means that another functional group is bonded instead of a hydrogen atom in a compound, and the position to be substituted is not limited as long as it is a position where a hydrogen atom is substituted, that is, a position where a substituent may be substituted, and when two or more substituents are substituted, two or more substituents may be the same or different from each other.

The term "substituted or unsubstituted" as used herein means unsubstituted or substituted with one or more substituents selected from the group consisting of heavy hydrogen; a halogen group; a cyano group; a nitro group; a hydroxy group; a carbonyl group; an ester group; an imide group; an amide group; a primary amino group; a carboxy group; a sulfonic acid group; a sulfonamide group; a phosphine oxide group; an alkoxy group; an aryloxy group; an alkyl thioxy group; an arylthioxy group; an alkyl sulfoxy group; an aryl sulfoxy group; a silyl group; a boron group; an alkyl group; a cycloalkyl group; an alkenyl group; an aryl group; an aralkyl group; an aralkenyl group; an alkyl aryl group; an alkoxysilylalkyl group; an arylphosphine group; or a heterocyclic group containing one or more of N, O and S atoms, or means unsubstituted or substituted in which two or more substituents of the substituents exemplified above are connected. For example, "a substituent in which two or more substituents are connected" may be a biphenyl group. That is, the biphenyl group may be an aryl group or may be interpreted as a substituent in which two phenyl groups are connected.

The alkyl group as used herein is a monovalent functional group derived from an alkane, and may be straight-chain or branched-chain. The straight-chain alkyl group may have 1 to 20 carbon atoms, but is not particularly limited in the number of carbon atoms. In addition, the branched-chain alkyl group has 3 to 20 carbon atoms. Examples of the alkyl group include, but are not limited to, methyl, ethyl, propyl, n-propyl, isopropyl, butyl, n-butyl, isobutyl, tert-butyl, sec-butyl, 1-methyl-butyl, 1-ethyl-butyl, pentyl, n-pentyl, iso-pentyl, neopentyl, tert-pentyl, hexyl, n-hexyl, 1-methylpentyl, 2-methylpentyl, 4-methyl-2-pentyl, 3,3-dimethylbutyl, 2-ethylbutyl, heptyl, n-heptyl, 1-methylhexyl, octyl, n-octyl, tert-octyl, 1-methylheptyl, 2-ethylhexyl, 2-propylpentyl, n-nonyl, 2,2-dimethylheptyl, 1-ethyl-propyl, 1,1-dimethyl-propyl, isohexyl, 2-methylpentyl, 4-methylhexyl, 5-methyl-hexyl, 2,6-dimethylheptan-4-yl, etc. The alkyl group may be substituted or unsubstituted, and examples of the substituent when substituted are as described above.

In this specification, silicon is not particularly limited, and may include conventionally known silicon without limitation, and may include, for example, amorphous silicon, crystalline silicon, or polycrystalline silicon.

Hereinafter, the present disclosure will be described in more detail.

According to an embodiment of the present disclosure, an etchant composition for etching silicon and silicon germanium may be provided. The etchant composition may include an oxidizing agent, a fluorine-based compound, water, and a surfactant represented by the following Chemical Formula 1.

[Chemical Formula 1]

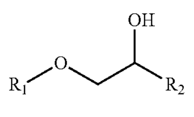

The surfactant may be contained in an amount of 5% to 40% by weight based on 100% by weight of the etchant composition. In Chemical Formula 1, $R_1$ may be an alkyl group having 2 to 4 carbon atoms, and $R_2$ may be hydrogen or an alkyl group having 1 to 3 carbon atoms.

In an embodiment, the etchant composition for etching silicon and silicon germanium may comprise an oxidizing agent. The oxidizer oxidizes a silicon surface to form an oxide film, and serves to convert fluoride anions contained in a fluorine-based compound to be described later so that they may be etched. Any material capable of oxidizing silicon and germanium in an aqueous solution may be used as the oxidizing agent without limitation. For example, the oxidizing agent may comprise one or more materials selected from the group consisting of hydrogen peroxide, nitric acid, nitrate, nitrite, periodic acid, iodine salt, perchloric acid, and perchlorate.

The content of the oxidizing agent may be 1% to 10% by weight, or 2% to 10% by weight, or 2% to 5% by weight, or 2% to 3% by weight, or 3% to 5% by weight based on 100% by weight of the total composition. When the content of the oxidizing agent is within the above range, the surface of silicon germanium is oxidized to generate Si—OH and Ge—OH, but they are not generated in all areas, so dangling bonds are formed, and etching is faster than fully oxidized silicon oxide films. This has the aspect of increasing the selectivity due to a faster etching rate than the silicon oxide film.

On the other hand, if the content of the oxidizing agent is excessively less than the above range, the oxidizing power is insufficient and the etching rate is too slow. If the content of the oxidizing agent is excessively greater than the above range, germanium (Ge) in silicon germanium is excessively oxidized to Ge—OH and dissolved in water, causing a problem in that the etching rate of silicon germanium is too fast.

Meanwhile, the etchant composition for etching silicon and silicon germanium according to an embodiment may comprise a fluorine-based compound. The fluorine-based compound refers to a compound containing a fluorine atom in a molecule, and more specifically, is an ionic compound containing a fluorine anion ($F^-$) as an anion, and collectively refers to a substance that forms various fluorine anions ($F^-$) when dissolved in an aqueous composition.

In some embodiments, a fluorine-based compound capable of isotropic etching rather than a hydroxide-based compound may be used for uniform etching. Representative examples of the fluorine-based compound include hydrofluoric acids such as hydrofluoric acid, fluoboric acid, and bifluoride, and fluorides composed of ionic bonds such as tetrabutylammonium fluoride, tetraethylammonium fluoride, tetramethylammonium fluoride, ammonium fluoride, and potassium fluoride.

For example, the fluorine-based compound may comprise tetraalkylammonium fluoride. Examples of the tetraalkylammonium fluoride include tetrabutylammonium fluoride, tetraethylammonium fluoride, and tetramethylammonium fluoride. The tetraalkylammonium fluoride may provide a fluorine-based compound where uniform etching is possible due to a surface adsorption effect of the quaternary alkylammonium cation.

The content of the fluorine-based compound may be 0.1% to 20% by weight, or 1% to 10% by weight, or 1% to 2% by weight, or 2% to 10% by weight based on 100% by weight of the total composition. If the content of the fluorine-based compound is excessively low in less than 0.1% by weight based on 100% by weight of the total composition, the etching rate is too slow to meet general process conditions. If the content of the fluorine-based compound is excessively high in excess of 20% by weight based on 100% by weight of the total composition, the etching rate is too fast and an etching variation in the substrate increases and may be non-uniform.

Meanwhile, the etchant composition for etching silicon and silicon germanium according to an embodiment may comprise a surfactant. The surfactant serves to make the etchant adhere well to a hydrophobic silicon surface. When surface wettability improves, the etchant acts uniformly on microroughness of the surface to improve the roughness after etching, and furthermore, the penetration of the micropattern is also increased, which serves to reduce distribution between patterns during etching.

The surfactant may be contained in an amount of 5% to 40% by weight, or 10% to 30% by weight, or 10% to 25% by weight, or 25% to 30% by weight based on 100% by weight of the etchant composition for etching silicon and silicon germanium. Within the above-mentioned range, the surface wettability is improved, and thus, after etching, a surface roughness may be reduced, or the penetration of the pattern may be improved.

If the surfactant is excessively low in less than 5% by weight based on 100% by weight of the etchant composition for etching silicon and silicon germanium, the effect of improving wettability by the surfactant is insignificant. On the other hand, if the surfactant is excessively high in excess of 40% by weight based on 100% by weight of the etchant composition for etching silicon and silicon germanium, the etching rate of silicon becomes too slow, and the etching rate of silicon germanium becomes faster than that of silicon.

In some embodiments, the surfactant may be represented by Chemical Formula 1 above. That is, the surfactant may be a nonionic surfactant as represented by Chemical Formula 1. In general, the surfactants are used to increase the wettability of the aqueous compositions, and the surfactants are divided into cationic, anionic, and nonionic surfactants. Cationic and anionic surfactants change a charge state on the local surface, so that a part of them has different etching rate. As a result, it is difficult to control surface roughness after etching.

On the other hand, the nonionic surfactant, as represented by Chemical Formula 1, may have a single or two or more ether groups and hydroxyl groups as a hydrophilic group, may be used in the aqueous compositions, and may have an alkyl group with a small molecular size as a hydrophobic group, thereby acting in fine patterns.

Unlike Chemical Formula 1, if three or more hydrophilic groups are repeated, the surface tension of the composition may not be lowered (e.g., glycerol), or the size may increase and the effect of improving the distribution of the patterns may decrease (e.g., triethylene glycol monomethyl ether).

In Chemical Formula 1, $R_1$ is an alkyl group having 2 to 4 carbon atoms, and $R_2$ is hydrogen or an alkyl group having 1 to 3 carbon atoms. In Chemical Formula 1, $R_1$ may be a straight-chain or branched-chain alkyl group having 2 to 4 carbon atoms, and $R_2$ may be hydrogen or a straight-chain or branched-chain alkyl group having 1 to 3 carbon atoms.

In Chemical Formula 1, when $R_1$ is an alkyl group having more than 4 carbon atoms, the hydrophobicity of the alkyl group becomes too large, and thus stains remain on the surface after etching. In addition, in Chemical Formula 1, when $R_1$ is a methyl group having 1 carbon atom or hydrogen, the polarity of the material increases and the intermolecular bond is strong, forming a larger secondary structure rather than a single molecule, thereby reducing the permeability between fine patterns.

In some embodiments, in Chemical Formula 1, $R_1$ may be a branched-chain alkyl group having 3 to 4 carbon atoms, and $R_2$ may be hydrogen. Examples of the branched-chain alkyl group having 3 to 4 carbon atoms include isopropyl, isobutyl, and tertbutyl. Some examples of the surfactant represented by Chemical Formula 1 in which $R_1$ is a branched-chain alkyl group having 3 to 4 carbon atoms and $R_2$ is hydrogen include ethylene glycol monoisopropyl ether, ethylene glycol monoisobutyl ether, and ethylene glycol mono-tert-butyl ether. As such, in Chemical Formula 1, when $R_1$ is a branched-chain alkyl group having 3 to 4 carbon atoms, the volume of the molecule is smaller than that of the straight-chain alkyl group, thereby reducing the interaction between substances. This has the effect of lowering the surface tension between materials, and thus has a technical aspect of easy penetration into the micropatterns compared to the case of using a straight-chain alkyl group having 3 to 4 carbon atoms.

In addition, in Chemical Formula 1, $R_1$ may be a straight-chain or branched-chain alkyl group having 2 to 4 carbon atoms, and $R_2$ may be a straight-chain alkyl group having 1 to 3 carbon atoms. Examples of the straight-chain or branched-chain alkyl group having 2 to 4 carbon atoms include ethyl, propyl, isopropyl, butyl, isobutyl, and tert-butyl. Examples of the straight-chain alkyl group having 1 to 3 carbon atoms include methyl, ethyl, and propyl. Examples of the surfactant represented by Chemical Formula 1 in which $R_1$ is a straight-chain or branched-chain alkyl group having 2 to 4 carbon atoms and $R_2$ is a straight-chain alkyl group having 1 to 3 carbon atoms include 1-ethoxy-2-propanol, 1-propoxy-2-propanol, 1-isoproxy-2-propanol, and 1-butoxy-2-propanol.

Meanwhile, the etchant composition for etching silicon and silicon germanium according to an embodiment may comprise water. The etchant composition according to the present disclosure is aqueous and comprises water as a solvent for dissolving one or more components of the composition. In the present disclosure, water may be used in various ways. The water used in the etchant composition may be deionized (DI) water.

The water may be contained in a remaining amount to fill 100% by weight of the total weight of the components other than water, and the water content is not particularly limited, but the water may be contained in for example, 45% to 95% by weight, or 45% to 89% by weight based on 100% by weight of the etchant composition for etching silicon and silicon germanium.

Meanwhile, the etchant composition for etching silicon and silicon germanium according to an embodiment may further comprise monocarboxylic acid, or a salt thereof. The monocarboxylic acid is a compound having one carboxyl group in the molecule, and examples thereof include acetic acid.

The monocarboxylic acid and a salt thereof may be used to improve the SiOx selectivity in the composition. The monocarboxylic acid, or a salt thereof ionize in water to form carboxylate anions. The generated anions combine with an —OH surface of the silicon oxide film through a hydrogen bond and serve to reduce the etching rate by hindering the access of etching species.

The salt of the monocarboxylic acid may be a non-metal salt of the monocarboxylic acid. The monocarboxylic acid metal salt may promote etching of a protective film (e.g., an oxide film) and decrease an etching selectivity. In addition, metal ions dissociated from the monocarboxylic acid metal salt may be residue on the film to be etched or the protective film, and may cause residues on the substrate or pattern, resulting in poor pattern shape.

Examples of the monocarboxylic acid, or salt thereof include acetic acid, propionic acid, butyric acid, valeric acid, benzoic acid, ammonium acetate, ammonium propionate, ammonium butyrate, ammonium valate, tetramethylammonium acetate, tetraethylammonium acetate, tetrabutyl ammonium acetate.

The monocarboxylic acid or the salt thereof may be contained in an amount of 0.05% to 5% by weight, or 0.05% to 1% by weight, or 0.05% to 0.12% by weight, or 0.05% to 0.1% by weight, or 0.1% to 5% by weight, or 0.1% to 1% by weight, or 0.1% to 0.12% by weight, or 0.12% to 5% by weight, or 0.12% to 1% by weight, or 1% to 5% by weight based on 100% by weight of the etchant composition of silicon and silicon germanium. If the monocarboxylic acid, or a salt thereof is excessively low in less than 0.05% by based on 100% by weight of the etchant composition for etching silicon and silicon germanium, an anticorrosive effect on oxide is insignificant. Further, if the monocarboxylic acid, or a salt thereof is excessively high in excess of 5% by weight based on 100% by weight of the etchant composition of silicon and silicon germanium, even Si oxidized by the oxidizing agent becomes all anticorrosive, thereby greatly reducing the etching rate of silicon.

Meanwhile, the etchant composition according to an embodiment may further comprise a pH adjusting agent. The pH of the composition may be adjusted through a pH adjusting agent, and the final pH may be 3 to 7 and/or 4 to 6. In aqueous compositions, silicon etching by fluoride is carried out by [HF], [$HF_2^-$] or larger ionic species lager than these, and when the pH of the composition is higher than 7, the ionized form of fluoride exists as $F^-$ and no substantial etching occurs. If the pH is lower than 3, the concentration of $HF_2^-$ in the ionic species is increased, and thus the etching rate of the silicon oxide film is too fast, so there is a problem in that the anticorrosive is not achieved.

An acidic or basic material may be used as the pH adjusting agent. However, materials that the material itself may interact with the silicon surface are avoided. For example, when the pH of the composition is adjusted using primary amine, secondary amine, and tertiary amine as basic materials, the silicon etching rate is slower than when the amines are attached to the silicon surface and controlled with quaternary amines. In some embodiments, quaternary amines may be used as a pH adjusting agent. Compared to primary amine, secondary amine, and tertiary amine, there is no space in the quaternary amine to attach to the silicon surface.

That is, the sum of primary amine, secondary amine, and tertiary amine contained in the etchant composition for etching silicon and silicon germanium according to an embodiment may be less than 0.001% by weight based on 100% by weight of the total composition. When the sum of the contents of primary amine, secondary amine, and tertiary amine contained in the etchant composition for etching silicon and silicon germanium according to an embodiment is less than 0.001% by weight based on 100% by weight of the total composition, it may mean that the primary amine, the secondary amine, and the tertiary amine are contained in an extremely small amount to be undetectable, or are not contained at all at 0% by weight.

On the other hand, the etchant composition for etching silicon and silicon germanium according to an embodiment may have an etching rate for silicon of 40 Å/min or more and less than 210 Å/min, or 40 Å/min or more and less than 60 Å/min, or 150 Å/min or more and less than 210 Å/min, or 60 Å/min or more and less than 150 Å/min, or 60 Å/min or more and less than 80 Å/min, or 120 Å/min or more and less than 150 Å/min, or 80 Å/min or more and less than 120 Å/min. The etchant composition for etching silicon and silicon germanium may have an etching rate ratio of silicon germanium to silicon of 1.3 or less, or 1.1 or less, or 1 or less, or 0.2 or more, or 0.3 or more. The etchant composition for etching silicon and silicon germanium may have an etching rate for silicon oxide of 7 Å/min or less, or 5 Å/min or less, or 2 Å/min or less, or 0.01 Å/min or more.

An example of a method for measuring the etching rate of silicon, silicon germanium, and silicon oxide is not particularly limited. For example, specimens were prepared by cutting crystalline silicon wafers, silicon germanium wafers, and silicon oxide film wafers into 1.5 cm×1.5 cm sizes, respectively, and a difference obtained by subtracting a thickness of the specimen after etching from a thickness of the specimen before etching may be obtained by dividing the total etching time.

The etchant composition for etching silicon and silicon germanium according to an embodiment has a high etching rate within the above range for silicon, has a low etching rate within the above range for silicon oxide, and thus may be quickly etched only for silicon, and may form a specific pattern while only a portion of silicon is removed by etching and the remaining silicon having a thin thickness is protected from additional etching through an anticorrosive effect on silicon oxide formed by etching silicon.

In addition, as the etching rate ratio of silicon germanium to silicon satisfies the above range, since the etching rate of silicon germanium is faster than the etching rate of silicon oxide, it is possible to implement an anticorrosive effect on silicon oxide formed by etching silicon, and it is possible to implement uniform etching performance by preventing an excessively large etching deviation between silicon and silicon germanium. The etching rate ratio of silicon germanium to silicon refers to a value obtained by dividing the etching rate of silicon germanium by the etching rate of silicon.

Meanwhile, if the etching rate for silicon is excessively reduced to less than 40 Å/min, the efficiency of the etching process may decrease due to the excessive reduction in the etching rate. If the etching rate for silicon is excessively increased in excess of 210 Å/min, it is difficult to implement uniform etching performance because the etching deviation between silicon and silicon germanium is excessively increased. Even if the etching rate ratio of silicon germanium to silicon is increased in excess of 1.3, it is difficult to implement uniform etching performance because the etching deviation between silicon and silicon germanium is excessively increased.

On the other hand, if the etching rate for silicon oxide is excessively increased to 7 Å/min or more, since the anticorrosive effect on silicon oxide formed by etching silicon is reduced, only a portion of silicon is removed by etching and remaining silicon having a thin thickness is not protected from additional etching and is completely removed, making it difficult to form a pattern.

Meanwhile, the surface roughness measured after etching the silicon layer with the etchant composition for etching silicon and silicon germanium according to an embodiment may be 1.5 nm or less, 0.5 nm or less, 0.1 nm or less, or 0.001 nm or more.

An example of a method of measuring the surface roughness after etching the silicon layer is not particularly limited. For example, a specimen is prepared by cutting a crystalline silicon wafer into 1.5×1.5 cm in a size, etching is performed with the etchant composition for etching silicon and silicon germanium, and then the surface roughness of the specimen may be measured using an atomic force microscope (AFM).

When the surface roughness measured after etching the silicon layer with the etchant composition for etching silicon and silicon germanium according to the embodiment is 1.5 nm or less, 0.5 nm or less, 0.1 nm or less, or 0.001 nm or more, the etchant is uniformly etched on the surface of the silicon layer so that the etching distribution between patterns may be small when micropatterns are etched, thereby increasing the reliability of the micropatterns. This is achieved through the high wettability of the etchant composition for etching silicon and silicon germanium according to an embodiment to the silicon layer.

Meanwhile, if the surface roughness measured after etching the silicon layer with the etchant composition for etching silicon and silicon germanium according to an embodiment is excessively increased in excess of 1.5 nm, during the silicon film etching process, it is difficult to maintain etching stability and reliability for preparing patterns with fine dimensions, which may cause a problem of decreasing reliability when the fine semiconductor device process is performed.

According to another embodiment of the present disclosure, an etchant composition for etching silicon and silicon germanium may include an oxidizing agent, a fluorine-based compound, water, and a surfactant represented by the following Chemical Formula 2.

[Chemical Formula 2]

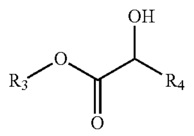

The surfactant may be contained in an amount of 5% to 40% by weight based on 100% by weight of the etchant composition for etching silicon and silicon germanium. In Chemical Formula 2, $R_3$ may be an alkyl group having 2 to 4 carbon atoms, and $R_4$ may be hydrogen or an alkyl group having 1 to 3 carbon atoms.

The contents related to the oxidizing agent, the fluorine-based compound, and the water may include the above descriptions as they are in the embodiment.

Meanwhile, the etchant composition for etching silicon and silicon germanium according to another embodiment may comprise a surfactant. The surfactant may be represented by Chemical Formula 2 above. In Chemical Formula 2, $R_3$ may be an alkyl group having 2 to 4 carbon atoms, and $R_4$ may be hydrogen or an alkyl group having 1 to 3 carbon atoms.

The surfactant serves to make the etchant adhere well to a hydrophobic silicon surface. When surface wettability improves, the etchant acts uniformly on microroughness of the surface to improve the roughness after etching, and furthermore, the penetration of the micropattern is also increased, which serves to reduce distribution between patterns during etching.

The surfactant may be contained in an amount of 5% to 40% by weight, or 10% to 30% by weight, or 10% to 25% by weight, or 25% to 30% by weight based on 100% by weight of the etchant composition for etching silicon and silicon germanium. Within the above range, the surface wettability is improved, and thus, after etching, surface roughness may be reduced, or the penetration of the pattern may be improved.

If the surfactant is excessively low in less than 5% by weight based on 100% by weight of the etchant composition for etching silicon and silicon germanium, the effect of improving wettability by the surfactant is insignificant. Further, if the surfactant is excessively high in excess of 40% by weight based on 100% by weight of the etchant composition for etching silicon and silicon germanium, the etching rate of silicon becomes too slow, and the etching rate of silicon germanium becomes faster than that of silicon.

The surfactant may be represented by Chemical Formula 2 above. That is, the surfactant may be a nonionic surfactant as represented by Chemical Formula 2. In general, the surfactants are used to increase the wettability of the aqueous compositions, and the surfactants are divided into cationic, anionic, and nonionic surfactants. Cationic and anionic surfactants change a charge state on the local surface, so that a part of them has different etching rate. As a result, it is difficult to control surface roughness after etching.

On the other hand, the nonionic surfactant, as represented by Chemical Formula 2, may have a single or two or more ether groups, carbonyl groups, and hydroxyl groups as a hydrophilic group, may be used in the aqueous compositions, and may have an alkyl group with a small molecular size as a hydrophobic group, thereby acting in fine patterns.

Unlike Chemical Formula 2, if three or more hydrophilic groups are repeated, the surface tension of the composition may not be lowered (e.g., glycerol), or the size may increase to reduce the effect of improving the distribution of the pattern (e.g., triethylene glycol monomethyl ether).

In Chemical Formula 2, $R_3$ may be an alkyl group having 2 to 4 carbon atoms, and $R_4$ may be hydrogen or an alkyl group having 1 to 3 carbon atoms. In Chemical Formula 2, $R_3$ may be a straight-chain or branched-chain alkyl group having 2 to 4 carbon atoms, and $R_4$ may be hydrogen or a straight-chain or branched-chain alkyl group having 1 to 3 carbon atoms.

In Chemical Formula 2, when $R_3$ is an alkyl group having more than 4 carbon atoms, the hydrophobicity of the alkyl group becomes too large, and thus stains remain on the surface after etching. In addition, in Chemical Formula 2, when $R_3$ is a methyl group having 1 carbon atom or hydrogen, the polarity of the material increases and the intermolecular bond is strong, forming a larger secondary structure rather than a single molecule, thereby reducing the permeability between fine patterns.

Examples of the straight-chain or branched-chain alkyl group having 2 to 4 carbon atoms include ethyl, propyl, isopropyl, butyl, isobutyl, and tert-butyl. Examples of the straight-chain alkyl group having 1 to 3 carbon atoms include methyl, ethyl, and propyl. Examples of the surfactant represented by Chemical Formula 2 wherein $R_3$ is a straight-chain or branched-chain alkyl group having 2 to 4 carbon atoms, and $R_4$ is a straight-chain alkyl group having 1 to 3 carbon atoms include ethyl lactate, propyl lactate, butyl lactate, and isobutyl lactate.

Meanwhile, the etchant composition for etching silicon and silicon germanium according to another embodiment may further comprise a monocarboxylic acid, or a salt thereof. The contents related to the monocarboxylic acid, or a salt thereof may include the above descriptions as they are in the embodiment.

Meanwhile, the etchant composition according to another embodiment may further comprise a pH adjusting agent. The contents related to the pH adjusting agent may include the above descriptions as they are in the embodiment.

Meanwhile, the sum of the contents of primary amine, secondary amine, and tertiary amine contained in the etchant composition for etching silicon and silicon germanium according to another embodiment may be less than 0.001% by weight based on 100% by weight of the total composition. When the sum of the contents of primary amine, secondary amine, and tertiary amine contained in the etchant composition for etching silicon and silicon germanium according to an embodiment is less than 0.001% by weight based on 100% by weight of the total composition, it may mean that the primary amine, the secondary amine, and the tertiary amine are contained in an extremely small amount to be undetectable, or are not contained at all at 0% by weight.

On the other hand, the etchant composition for etching silicon and silicon germanium according to another embodiment may have an etching rate for silicon of 80 Å/min or more and less than 120 Å/min, an etching rate ratio of silicon germanium to silicon of 1 or less, or 0.5 or more, and an etching rate for silicon oxide of 2 Å/min or less, or 0.01 Å/min or more. The contents related to the etching rate for silicon, the etching rate ratio of silicon germanium to silicon, and the etching rate for silicon oxide may include the above descriptions as they are in the embodiment.

Meanwhile, the surface roughness measured after etching the silicon layer with the etchant composition for etching silicon and silicon germanium according to an embodiment may be 0.1 nm or less, or 0.001 nm or more. The contents related to the surface roughness may include the above descriptions as they are in the embodiment.

According to another embodiment of the present disclosure, a preparation method of a pattern including: forming a semiconductor device including a silicon layer and a silicon germanium layer; and etching the semiconductor device with the etchant composition for etching silicon and silicon germanium according to an embodiment or another embodiment may be provided.

The contents related to the etchant composition for etching silicon and silicon germanium may include the above descriptions as they are in an embodiment or another embodiment.

Semiconductor devices may correspond to semiconductor substrates (e.g., wafers), flat panel displays, phase change memory devices, solar panels and solar substrates, photovoltaic cells, microelectronics, integrated circuits, or a variety of products including microelectromechanical systems (MEMs) manufactured for use in computer chip applications.

The semiconductor device including the silicon layer and the silicon germanium layer may be a silicon substrate material of the semiconductor device. As an example of the silicon substrate material, the epi-stack may be formed by alternately stacking a silicon layer 1 and a silicon germanium layer 2 as illustrated in FIG. 1, where the silicon germanium layer is a sacrificial layer, and the silicon layer is a channel layer.

Examples of a method of forming the semiconductor device are not particularly limited, and various methods widely known in the semiconductor field may be applied without limitation. For example, as illustrated in FIG. 1, a method of alternately depositing a silicon layer 1 and a silicon germanium layer 2 on a silicon wafer may be mentioned.

In the etching of the semiconductor device with the etchant composition for etching silicon and silicon germanium according to an embodiment or another embodiment, the etching method may be carried out by a method commonly known in the art. For example, a method using immersion, spraying, or immersion and spraying may be used in a batch type etching device or a single type etching device, and the etching method is not limited in any particular way.

However, for example, a method in which a silicon substrate material on which a silicon layer and a silicon germanium layer are alternately deposited on the silicon wafer is rotated by 90 degrees so that the silicon layer and the silicon germanium layer are in contact with the etchant composition at the same time, may be mentioned.

On the other hand, in the step of etching with the etchant composition for etching silicon and silicon germanium, an etching rate for silicon may be 40 Å/min or more and less than 210 Å/min, or 40 Å/min or more and less than 60 Å/min, or 150 Å/min or more and less than 210 Å/min, or 60 Å/min or more and less than 150 Å/min, or 60 Å/min or more and less than 80 Å/min, or 120 Å/min or more and less than 150 Å/min, or 80 Å/min or more and less than 120 Å/min. An etching rate ratio of silicon germanium to silicon may be 1.3 or less, or 1.1 or less, or 1 or less, or 0.2 or more, or 0.3 or more. An etching rate for silicon oxide may be 7 Å/min or less, or 5 Å/min or less, or 2 Å/min or less, or 0.01 Å/min or more.

An example of a method for measuring the etching rate of silicon, silicon germanium, and silicon oxide is not particularly limited. For example, specimens were prepared by cutting crystalline silicon wafers, silicon germanium wafers, and silicon oxide film wafers into 1.5 cm×1.5 cm sizes, respectively, and a difference obtained by subtracting a thickness of the specimen after etching from a thickness of the specimen before etching may be obtained by dividing the total etching time.

The etchant composition for etching silicon and silicon germanium has a high etching rate within the above range for silicon, has a low etching rate within the above range for silicon oxide, and thus may be quickly etched only for silicon, and may form a specific pattern while only a portion of silicon is removed by etching and the remaining silicon having a thin thickness is protected from additional etching through an anticorrosive effect on silicon oxide formed by etching silicon.

In addition, as the etching rate ratio of silicon germanium to silicon satisfies the above range, since the etching rate of silicon germanium is faster than the etching rate of silicon oxide, it is possible to implement an anticorrosive effect on silicon oxide formed by etching silicon, and it is possible to implement uniform etching performance by preventing an excessively large etching deviation between silicon and silicon germanium. The etching rate ratio of silicon germanium to silicon refers to a value obtained by dividing the etching rate of silicon germanium by the etching rate of silicon.

Meanwhile, if the etching rate for silicon is excessively reduced to less than 40 Å/min, the efficiency of the etching process may decrease due to the excessive reduction in the etching rate. If the etching rate for silicon is excessively increased in excess of 210 Å/min, it is difficult to implement uniform etching performance because the etching deviation between silicon and silicon germanium is excessively increased. Even if the etching rate ratio of silicon germanium to silicon is increased in excess of 1.3, it is difficult to implement uniform etching performance because the etching deviation between silicon and silicon germanium is excessively increased.

On the other hand, if the etching rate for silicon oxide is excessively increased to 7 Å/min or more, since the anticorrosive effect on silicon oxide formed by etching silicon is reduced, only a portion of silicon is removed by etching and remaining silicon having a thin thickness is not protected from additional etching and is completely removed, making it difficult to form a pattern.

Meanwhile, the surface roughness of the silicon layer measured after the step of etching with the etchant composition for etching silicon and silicon germanium, may be 1.5 nm or less, 0.5 nm or less, 0.1 nm or less, or 0.001 nm or more.

An example of a method of measuring the surface roughness of the silicon layer measured after etching the silicon layer with the etchant composition for etching silicon and silicon germanium is not particularly limited. For example, a specimen is prepared by cutting a crystalline silicon wafer into 1.5×1.5 cm in a size, etching is performed with the etchant composition for etching silicon and silicon germanium, and then the surface roughness of the specimen may be measured using an atomic force microscope (AFM).

When the surface roughness of the silicon layer measured after etching the silicon layer with the etchant composition for etching silicon and silicon germanium is 1.5 nm or less, 0.5 nm or less, 0.1 nm or less, or 0.001 nm or more, the etchant is uniformly etched on the surface of the silicon layer so that the etching distribution between patterns may be small when micropatterns are etched, thereby increasing the reliability of the micropatterns. This is achieved through the high wettability of the etchant composition for etching silicon and silicon germanium according to an embodiment to the silicon layer.

Meanwhile, if the surface roughness of the silicon layer measured after etching the silicon layer with the etchant composition for etching silicon and silicon germanium is excessively increased in excess of 1.5 nm, during the silicon film etching process, it is difficult to maintain etching stability and reliability for preparing patterns with fine dimensions, which may decrease reliability when a fine semiconductor device process is performed.

After the etching step, a washing step or a drying step may be additionally carried out, if necessary, and the washing and drying methods may be carried out by a method commonly known in the art, and the washing and drying methods are not limited in any particular way.

According to the embodiments, it is possible to provide an etchant composition for etching silicon and silicon germanium that has a uniform surface after performing etching while etching a silicon film and a silicon germanium film at a desired rate, reduces the distribution of patterns due to easy penetration of the composition into micropatterns, and does not etch a silicon oxide film around single crystal silicon during an etching process, and a preparation method of a pattern using the same.

Examples and Comparative Examples

Etchant compositions of Examples and Comparative Examples were prepared by performing mixing using the components and contents described in Table 1, Table 2, and Table 3 below. In Tables 1-3, "D." is an abbreviation for "Division," "Con." is an abbreviation for "Content," and "DI water" is an abbreviation for deionized water.

TABLE 1

| Examples | Oxidizing agent D | Oxidizing agent Con. (wt %) | Fluoride D | Fluoride Con. (wt %) | Surfactant D | Surfactant Con. (wt %) | Carboxylic acid D | Carboxylic acid Con. (wt %) | pH adjusting agent D | pH adjusting agent Con. (wt %) | DI water Con. (wt %) |
|---|---|---|---|---|---|---|---|---|---|---|---|
| Example 1 | A-1 | 2.00 | B-1 | 2.00 | C-3 | 25.00 | — | 0.00 | — | 0.00 | 71.00 |
| Example 2 | A-1 | 2.00 | B-1 | 2.00 | C-3 | 25.00 | D-2 | 0.12 | — | 0 | 70.88 |
| Example 3 | A-1 | 2.00 | B-1 | 2.00 | C-3 | 25.00 | D-3 | 1.00 | — | 0 | 70 |
| Example 4 | A-1 | 0.50 | B-1 | 2.00 | C-3 | 25.00 | D-1 | 0.10 | E-1 | 0.11 | 72.29 |
| Example 5 | A-1 | 1.00 | B-1 | 2.00 | C-3 | 25.00 | D-1 | 0.10 | E-1 | 0.11 | 71.79 |
| Example 6 | A-1 | 2.00 | B-1 | 2.00 | C-3 | 25.00 | D-1 | 0.10 | E-1 | 0.11 | 70.79 |
| Example 7 | A-1 | 3.00 | B-1 | 2.00 | C-3 | 25.00 | D-1 | 0.10 | E-1 | 0.11 | 69.79 |
| Example 8 | A-1 | 5.00 | B-1 | 2.00 | C-3 | 25.00 | D-1 | 0.10 | E-1 | 0.11 | 67.79 |
| Example 9 | A-1 | 10.00 | B-1 | 2.00 | C-3 | 25.00 | D-1 | 0.10 | E-1 | 0.11 | 62.79 |
| Example 10 | A-1 | 12.00 | B-1 | 2.00 | C-3 | 25.00 | D-1 | 0.10 | E-1 | 0.11 | 60.79 |
| Example 11 | A-1 | 2.00 | B-1 | 0.05 | C-3 | 25.00 | D-1 | 0.10 | E-1 | 0.11 | 72.74 |
| Example 12 | A-1 | 2.00 | B-1 | 0.10 | C-3 | 25.00 | D-1 | 0.10 | E-1 | 0.11 | 72.69 |
| Example 13 | A-1 | 2.00 | B-1 | 1.00 | C-3 | 25.00 | D-1 | 0.10 | E-1 | 0.11 | 71.79 |
| Example 14 | A-1 | 2.00 | B-1 | 10.00 | C-3 | 25.00 | D-1 | 0.10 | E-1 | 0.04 | 62.86 |
| Example 15 | A-1 | 2.00 | B-1 | 20.00 | C-3 | 25.00 | D-1 | 0.10 | E-2 | 0.31 | 52.59 |
| Example 16 | A-1 | 2.00 | B-1 | 22.00 | C-3 | 25.00 | D-1 | 0.10 | E-2 | 0.33 | 50.57 |
| Example 17 | A-1 | 2.00 | B-2 | 0.50 | C-3 | 25.00 | D-1 | 0.10 | E-1 | 0.52 | 71.88 |
| Example 18 | A-1 | 2.00 | B-3 | 10.00 | C-3 | 25.00 | D-1 | 0.10 | E-2 | 1.05 | 61.85 |
| Example 19 | A-1 | 2.00 | B-1 | 2.00 | C-3 | 5.00 | D-1 | 0.10 | E-1 | 0.11 | 90.79 |
| Example 20 | A-1 | 2.00 | B-1 | 2.00 | C-3 | 10.00 | D-1 | 0.10 | E-1 | 0.11 | 85.79 |
| Example 21 | A-1 | 2.00 | B-1 | 2.00 | C-3 | 30.00 | D-1 | 0.10 | E-1 | 0.11 | 65.79 |
| Example 22 | A-1 | 2.00 | B-1 | 2.00 | C-3 | 40.00 | D-1 | 0.10 | E-1 | 0.11 | 55.79 |
| Example 23 | A-1 | 2.00 | B-1 | 2.00 | C-1 | 25.00 | D-1 | 0.10 | E-1 | 0.11 | 70.79 |
| Example 24 | A-1 | 2.00 | B-1 | 2.00 | C-2 | 25.00 | D-1 | 0.10 | E-1 | 0.11 | 70.79 |
| Example 25 | A-1 | 2.00 | B-1 | 2.00 | C-4 | 25.00 | D-1 | 0.10 | E-1 | 0.11 | 70.79 |
| Example 26 | A-1 | 2.00 | B-1 | 2.00 | C-5 | 25.00 | D-1 | 0.10 | E-1 | 0.11 | 70.79 |
| Example 27 | A-1 | 2.00 | B-1 | 2.00 | C-6 | 25.00 | D-1 | 0.10 | E-1 | 0.11 | 70.79 |
| Example 28 | A-1 | 2.00 | B-1 | 2.00 | C-8 | 25.00 | D-1 | 0.10 | E-1 | 0.11 | 70.79 |
| Example 29 | A-1 | 2.00 | B-1 | 2.00 | C-9 | 25.00 | D-1 | 0.10 | E-1 | 0.11 | 70.79 |
| Example 30 | A-1 | 2.00 | B-1 | 2.00 | C-10 | 25.00 | D-1 | 0.10 | E-1 | 0.11 | 70.79 |
| Example 31 | A-1 | 2.00 | B-1 | 2.00 | C-11 | 25.00 | D-1 | 0.10 | E-1 | 0.11 | 70.79 |
| Example 32 | A-1 | 2.00 | B-1 | 2.00 | C-13 | 25.00 | D-1 | 0.10 | E-1 | 0.11 | 70.79 |
| Example 33 | A-1 | 2.00 | B-1 | 2.00 | C-14 | 25.00 | D-1 | 0.10 | E-1 | 0.11 | 70.79 |
| Example 34 | A-1 | 2.00 | B-1 | 2.00 | C-15 | 25.00 | D-1 | 0.10 | E-1 | 0.11 | 70.79 |
| Example 35 | A-1 | 2.00 | B-1 | 2.00 | C-16 | 25.00 | D-1 | 0.10 | E-1 | 0.11 | 70.79 |
| Example 36 | A-1 | 2.00 | B-1 | 2.00 | C-3 | 25.00 | D-1 | 0.05 | E-1 | 0.05 | 70.9 |
| Example 37 | A-1 | 2.00 | B-1 | 2.00 | C-3 | 25.00 | D-1 | 1.00 | E-1 | 1.08 | 68.92 |
| Example 38 | A-1 | 2.00 | B-1 | 2.00 | C-3 | 25.00 | D-1 | 5.00 | E-1 | 5.40 | 60.6 |
| Example 39 | A-1 | 2.00 | B-1 | 2.00 | C-3 | 25.00 | D-1 | 7.00 | E-1 | 7.56 | 56.44 |

TABLE 2

| Examples | Oxidizing agent D. | Oxidizing agent Con. (wt %) | Fluoride D. | Fluoride Con. (wt %) | Surfactant D. | Surfactant Con. (wt %) | Carboxylic acid D. | Carboxylic acid Con. (wt %) | pH adjusting agent D. | pH adjusting agent Con. (wt %) | DI water Con. (wt %) | pH |
|---|---|---|---|---|---|---|---|---|---|---|---|---|
| Example 40 | A-1 | 2.00 | B-1 | 2.00 | C-3 | 25.00 | D-1 | 0.10 | — | 0 | 70.9 | 2.9 |
| Example 41 | A-1 | 2.00 | B-1 | 2.00 | C-3 | 25.00 | D-1 | 0.10 | E-1 | 0.05 | 70.85 | 3.9 |
| Example 42 | A-1 | 2.00 | B-1 | 2.00 | C-3 | 25.00 | D-1 | 0.10 | E-1 | 0.15 | 70.75 | 5.3 |
| Example 43 | A-1 | 2.00 | B-1 | 2.00 | C-3 | 25.00 | D-1 | 0.10 | E-1 | 0.17 | 70.73 | 6.1 |
| Example 44 | A-1 | 2.00 | B-1 | 2.00 | C-3 | 25.00 | D-1 | 0.10 | E-1 | 0.21 | 70.69 | 7.0 |
| Example 45 | A-1 | 2.00 | B-1 | 2.00 | C-3 | 25.00 | D-1 | 0.10 | E-1 | 0.25 | 70.65 | 7.8 |

TABLE 3

| Comparative Examples | Oxidizing agent D. | Oxidizing agent Con. (wt %) | Fluoride D. | Fluoride Con. (wt %) | Surfactant D. | Surfactant Con. (wt %) | Carboxylic acid D. | Carboxylic acid Con. (wt %) | pH adjust agent D. | pH adjust agent Con. (wt %) | DI water Con. (wt %) |
|---|---|---|---|---|---|---|---|---|---|---|---|
| Comparative Example 1 | A-1 | 0.00 | B-1 | 2.00 | C-3 | 25.00 | D-1 | 0.10 | E-1 | 0.11 | 72.79 |
| Comparative Example 2 | A-1 | 2.00 | B-1 | 0.00 | C-3 | 25.00 | D-1 | 0.10 | E-1 | 0.11 | 72.79 |
| Comparative Example 3 | A-1 | 2.00 | B-1 | 2.00 | C-3 | 0.00 | D-1 | 0.10 | E-1 | 0.11 | 95.79 |

TABLE 3-continued

| | Oxidizing agent | | Fluoride | | Surfactant | | Carboxylic acid | | pH adjust agent | | DI water |
|---|---|---|---|---|---|---|---|---|---|---|---|
| Comparative Examples | D. | Con. (wt %) | D. | Con. (wt %) | D. | Con. (wt %) | D. | Con. (wt %) | D. | Con. (wt %) | Con. (wt %) |
| Comparative Example 4 | A-1 | 2.00 | B-1 | 2.00 | C-7 | 25.00 | D-1 | 0.10 | E-1 | 0.11 | 70.79 |
| Comparative Example 5 | A-1 | 2.00 | B-1 | 2.00 | C-12 | 25.00 | D-1 | 0.10 | E-1 | 0.11 | 70.79 |
| Comparative Example 6 | A-1 | 2.00 | B-1 | 2.00 | C-17 | 25.00 | D-1 | 0.10 | E-1 | 0.11 | 70.79 |
| Comparative Example 7 | A-1 | 2.00 | B-1 | 2.00 | C-18 | 25.00 | D-1 | 0.10 | E-1 | 0.11 | 70.79 |
| Comparative Example 8 | A-1 | 2.00 | B-1 | 2.00 | C-19 | 1.00 | D-1 | 0.10 | E-1 | 0.11 | 94.79 |
| Comparative Example 9 | A-1 | 2.00 | B-1 | 2.00 | C-20 | 1.00 | D-1 | 0.10 | E-1 | 0.11 | 94.79 |
| Comparative Example 10 | A-1 | 2.00 | B-1 | 2.00 | C-21 | 25.00 | D-1 | 0.10 | E-1 | 0.11 | 70.79 |
| Comparative Example 11 | A-1 | 2.00 | B-1 | 2.00 | C-22 | 25.00 | D-1 | 0.10 | E-1 | 0.11 | 70.79 |
| Comparative Example 12 | A-1 | 2.00 | B-1 | 2.00 | C-1 | 2.00 | D-1 | 0.10 | E-1 | 0.11 | 93.79 |
| Comparative Example 13 | A-1 | 2.00 | B-1 | 2.00 | C-3 | 4.00 | D-1 | 0.10 | E-1 | 0.11 | 91.79 |
| Comparative Example 14 | A-1 | 2.00 | B-1 | 2.00 | C-3 | 45.00 | D-1 | 0.10 | E-1 | 0.11 | 50.79 |

The components used in Tables 1, 2, and 3 are summarized in Table 4 below.

TABLE 4

| Division | Symbol | Substance name |
|---|---|---|
| A. Oxidizing agent | A-1 | Hydrogen peroxide |
| B. Fluoride | B-1 | Tetrabutylammonium fluoride |
| | B-2 | Hydrofluoric acid |
| | B-3 | Ammonium fluoride |
| C. Surfactant | C-1 | Ethylene glycol monoethyl ether |
| | C-2 | Ethylene glycol monopropyl ether |
| | C-3 | Ethylene glycol monoisopropyl ether |
| | C-4 | Ethylene glycol monobutyl ether |
| | C-5 | Ethylene glycol monoisobutyl ether |
| | C-6 | Ethylene glycol mono-tert-butylether |
| | C-7 | 1-methoxy-2-propanol |
| | C-8 | 1-ethoxy-2-propanol |
| | C-9 | 1-propoxy-2-propanol |
| | C-10 | 1-isoproxy-2-propanol |
| | C-11 | 1-butoxy-2-propanol |
| | C-12 | Methyl lactate |
| | C-13 | Ethyl lactate |
| | C-14 | Propyl lactate |
| | C-15 | Butyl lactate |
| | C-16 | Isobutyl lactate |
| | C-17 | Glycerol |
| | C-18 | Triethylene glycol monomethyl ether |
| | C-19 | Sodium dodecylsulfate |
| | C-20 | Cetrimonium bromide |
| | C-21 | Amyl lactate |
| | C-22 | Ethylene glycol monohexyl ether |
| D. Carboxylic acid | D-1 | Acetic acid |
| | D-2 | Ammonium acetate |
| | D-3 | Tetrabutylammonium acetate |
| E. pH adjusting agent | E-1 | Tetramethylammonium hydroxide |
| | E-2 | Methanesulfonic acid |

Experimental Examples

The physical properties of the etchant compositions of Examples and Comparative Examples were measured by the following method, and the results are shown in Table 5.

Evaluation of Etching Rate

A specimen was prepared by cutting a crystalline silicon wafer, a silicon germanium wafer, and a silicon oxide wafer into 1.5 cm×1.5 in a size. The specimen was immersed in diluted HF (DHF) (200:1) at room temperature for 1 minute to remove the native oxide layer from the surface. Thereafter, the pre-etching thickness was measured using an ellipsometer, the specimen was heated to 60° C. in the etchant compositions of Examples and Comparative Examples, and then immersed in crystalline silicon and silicon germanium for 1 minute and silicon oxide film for 5 minutes while stirring at a rotational speed of 400 rpm using a magnetic bar. Then, the specimen was taken out, washed with ultrapure water, dried using air, and then etched using an ellipsometer to measure the thickness of the specimen to calculate the etching rate of each specimen. The evaluation criteria are as follows.

<Criteria> Etching Rate of Single Crystal Silicon

- ⊚: etching rate of 80 Å/min or more and less than 120 Å/min
- ○: etching rate of 60 Å/min or more and less than 80 Å/min, or 120 Å/min or more and less than 150 Å/min
- Δ: etching rate of 40 Å/min or more and less than 60 Å/min, or 150 Å/min or more and less than 210 Å/min
- X: etching rate of less than 40 Å/min, or 210 Å/min or more <Criteria> Etching Rate Ratio of Silicon Germanium/Single Crystal Silicon

- ⊚: etching rate ratio of 1 or less
- ○: etching rate ratio greater than 1 and less than or equal to 1.10
- Δ: etching rate ratio greater than 1.10 and less than or equal to 1.30
- X: etching rate ratio greater than 1.30

<Criteria> Etching Rate of Silicon Oxide Layer

- ⊚: etching rate of 2 Å/min or less
- ○: etching rate greater than 2 Å/min and less than or equal to 5 Å/min
- Δ: etching rate greater than 5 Å/min and less than or equal to 7 Å/min
- X: etching rate of 7 Å/min or more (2) Evaluation of Surface Condition In the evaluation of the etching rate of Experimental Example 1 described above, it was confirmed whether there were any stains on the surface of the etched crystalline silicon film. If stains are observed, additional washing was performed with ultrapure water for 30 seconds, and then drying was performed using air to confirm that stains were removed. In addition, surface roughness (Rq) was measured using an atomic force microscope (AFM). The evaluation criteria are as follows.

<Criteria> Observation of Surface Stains

○: No surface stains

Δ: A slight stain remains, but may be removed by additional cleaning

X: Stains remain on the entire surface, or stains remain even after additional cleaning <Criteria> Surface Roughness (Rq)

◎: 0.1 nm or less

○: greater than 0.1 nm and less than or equal to 0.5 nm

Δ: greater than 0.5 nm and less than or equal to 1.5 nm

X: greater than 1.5 nm (3) Evaluation of Chemical Solution Penetration

Surface tension was measured using a static surface tensiometer to measure the penetration of the etchant compositions of Examples and Comparative Examples. In addition, a patterned substrate in which crystalline silicon was stacked in 8 stages in a "E" shape was prepared to confirm an effect in the micropatterns, and then the substrate was immersed in DHF (200:1) for 1 minute at room temperature to remove the native oxide layer from the surface. The pattern substrate was immersed in the composition heated to 60° C. and then etched while stirring at a speed of 400 rpm using a magnetic bar. After etching, the cross section of the pattern was viewed with SEM and a removal quality factor was measured.

<Criteria> Micropattern Quality Factor

○: It was confirmed that all of 8 stages of 8 stages were etched

Δ: All of 8 stages were etched, but residues remained

X: Unetched portions existed

TABLE 5

| Division | Etching rate evaluation: Etching rate of single crystal silicon | Etching rate evaluation: Etching rate ratio of silicon germanium/single crystal silicon | Etching rate evaluation: Etching rate of silicon oxide layer | Surface condition evalution: Surface stain observation | Surface condition evalution: Surface roughness | Penetration evaluation: Surface tension (mN/m) | Penetration evaluation: Fine pattern quality factor |
|---|---|---|---|---|---|---|---|
| Example 1 | ◎ | ◎ | ○ | ○ | ○ | 34 | ○ |
| Example 2 | ◎ | ◎ | ○ | ○ | ◎ | 34 | ○ |
| Example 3 | ◎ | ◎ | ○ | ○ | ◎ | 34 | ○ |
| Example 4 | Δ | ○ | Δ | ○ | ◎ | 33 | Δ |
| Example 5 | ○ | ○ | ○ | ○ | ◎ | 33 | ○ |
| Example 6 | ◎ | ◎ | ◎ | ○ | ◎ | 34 | ○ |
| Example 7 | ◎ | ◎ | ◎ | ○ | ◎ | 33 | ○ |
| Example 8 | ◎ | ○ | ◎ | ○ | ◎ | 34 | ○ |
| Example 9 | ○ | Δ | ◎ | ○ | ◎ | 33 | ○ |
| Example 10 | Δ | Δ | ◎ | ○ | ◎ | 34 | ○ |
| Example 11 | Δ | ○ | ◎ | ○ | ◎ | 33 | Δ |
| Example 12 | ○ | ○ | ◎ | ○ | ◎ | 33 | ○ |
| Example 13 | ◎ | ◎ | ◎ | ○ | ◎ | 33 | ○ |
| Example 14 | ◎ | ◎ | ○ | ○ | ◎ | 33 | ○ |
| Example 15 | ○ | ◎ | Δ | ○ | ○ | 33 | ○ |
| Example 16 | Δ | ◎ | Δ | ○ | Δ | 33 | ○ |
| Example 17 | ◎ | ◎ | ◎ | ○ | ○ | 33 | ○ |
| Example 18 | ◎ | ◎ | ◎ | ○ | ◎ | 33 | ○ |
| Example 19 | ○ | ○ | ◎ | ○ | ○ | 46 | ○ |
| Example 20 | ◎ | ◎ | ◎ | ○ | ◎ | 41 | ○ |
| Example 21 | ◎ | ◎ | ◎ | ○ | ◎ | 36 | ○ |
| Example 22 | ○ | ○ | ◎ | ○ | ◎ | 32 | ○ |
| Example 23 | ◎ | ◎ | ◎ | ○ | ◎ | 38 | ○ |
| Example 24 | ◎ | ◎ | ◎ | ○ | ◎ | 33 | ○ |
| Example 25 | ◎ | ◎ | ◎ | Δ | ◎ | 29 | ○ |
| Example 26 | ◎ | ◎ | ◎ | Δ | ◎ | 29 | ○ |
| Example 27 | ◎ | ◎ | ◎ | Δ | ◎ | 29 | ○ |
| Example 28 | ◎ | ◎ | ◎ | ○ | ◎ | 37 | ○ |
| Example 29 | ◎ | ◎ | ◎ | ○ | ◎ | 35 | ○ |
| Example 30 | ◎ | ◎ | ◎ | ○ | ◎ | 36 | ○ |
| Example 31 | ◎ | ◎ | ◎ | Δ | ◎ | 30 | Δ |
| Example 32 | ◎ | ◎ | ◎ | ○ | ◎ | 34 | ○ |
| Example 33 | ◎ | ◎ | ◎ | ○ | ◎ | 34 | ○ |
| Example 34 | ◎ | ◎ | ◎ | Δ | ◎ | 30 | Δ |
| Example 35 | ◎ | ◎ | ◎ | Δ | ◎ | 30 | Δ |
| Example 36 | ○ | ○ | Δ | ○ | ○ | 34 | ○ |
| Example 37 | ◎ | ◎ | ○ | ○ | ◎ | 34 | ○ |
| Example 38 | ○ | ○ | ◎ | ○ | ◎ | 33 | ○ |
| Example 39 | Δ | Δ | ◎ | ○ | ◎ | 33 | ○ |
| Example 40 | ○ | ◎ | Δ | ○ | Δ | 33 | ○ |
| Example 41 | ◎ | ◎ | ◎ | ○ | ○ | 34 | ○ |
| Example 42 | ◎ | ◎ | ◎ | ○ | ◎ | 33 | ○ |
| Example 43 | ◎ | ◎ | ◎ | ○ | ◎ | 33 | ○ |
| Example 44 | ○ | ◎ | ◎ | ○ | ◎ | 33 | ○ |

TABLE 5-continued

| | Etching rate evaluation | | | Surface condition evalution | | Penetration evaluation | |
|---|---|---|---|---|---|---|---|
| Division | Etching rate of single crystal silicon | Etching rate ratio of silicon germanium/single crystal silicon | Etching rate of silicon oxide layer | Surface stain observation | Surface roughness | Surface tension (mN/m) | Fine pattern quality factor |
| Example 45 | Δ | ◎ | ◎ | ○ | ◎ | 34 | Δ |
| Comparative Example 1 | X | ○ | ◎ | ○ | ◎ | 33 | X |
| Comparative Example 2 | X | X | ◎ | ○ | ◎ | 33 | X |
| Comparative Example 3 | ○ | ◎ | ○ | ○ | Δ | 58 | X |
| Comparative Example 4 | ◎ | ◎ | ◎ | ○ | ◎ | 36 | X |
| Comparative Example 5 | ◎ | ◎ | ◎ | ○ | ◎ | 36 | X |
| Comparative Example 6 | ◎ | ◎ | ◎ | ○ | ◎ | 56 | X |
| Comparative Example 7 | ◎ | ◎ | ◎ | ○ | ◎ | 33 | X |
| Comparative Example 8 | ○ | Δ | Δ | ○ | Δ | 32 | X |
| Comparative Example 9 | Δ | Δ | Δ | ○ | Δ | 30 | X |
| Comparative Example 10 | Δ | Δ | X | X | X | 31 | X |
| Comparative Example 11 | Δ | Δ | Δ | X | X | 31 | X |
| Comparative Example 12 | ○ | ◎ | ○ | ○ | Δ | 56 | X |
| Comparative Example 13 | ○ | ○ | ○ | ○ | Δ | 54 | Δ |
| Comparative Example 14 | Δ | Δ | ◎ | ○ | ◎ | 31 | Δ |

As shown in Table 5, It could be confirmed from Table 5 that the performance of the etchants of Examples [etch ratio by film quality (crystalline silicon, silicon germanium, silicon oxide film), roughness after etching, chemical solution penetration in the pattern] was superior to that of the Comparative Examples.

DESCRIPTION OF SYMBOLS

1: Silicon
2: Silicon germanium

While embodiments of inventive concepts have been described, it is to be understood that inventive concepts are not limited to the disclosed embodiments. On the contrary, inventive concepts are intended to cover various modifications and equivalent arrangements included within the spirit and scope of the appended claims.

What is claimed is:

1. An etchant composition for etching silicon and silicon germanium, the etchant composition comprising:

an oxidizing agent;

a fluorine-based compound;

water; and a surfactant represented by Chemical Formula 1,

[Chemical Formula 1]

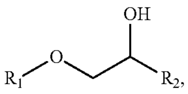

wherein the surfactant is contained in an amount of 5% to 40% by weight based on 100% by weight of the etchant composition, wherein, in Chemical Formula 1, $R_1$ is an alkyl group having 2 to 4 carbon atoms, and $R_2$ is hydrogen or an alkyl group having 1 to 3 carbon atoms, wherein a sum of contents of a primary amine, a secondary amine, and a tertiary amine contained in the etchant composition is less than 0.001% by weight based on 100% by weight of the etchant composition.

2. The etchant composition of claim 1, wherein in Chemical Formula 1, $R_1$ is a branched-chain alkyl group having 3 to 4 carbon atoms, and $R_2$ is hydrogen.

3. The etchant composition of claim 1, wherein in Chemical Formula 1, $R_1$ is a straight-chain or branched-chain alkyl group having 2 to 4 carbon atoms, and $R_2$ is a straight-chain alkyl group having 1 to 3 carbon atoms.

4. The etchant composition of claim 1, further comprising:

a monocarboxylic acid or a salt thereof.

5. The etchant composition of claim 4, wherein the monocarboxylic acid or the salt thereof is acetic acid.

6. The etchant composition of claim 4, wherein the etchant composition consists essentially of the oxidizing agent, the fluorine-based compound, the surfactant represented by Chemical Formula 1, the water, and the monocarboxylic acid or the salt thereof.

7. The etchant composition of claim 4, wherein the etchant composition consists of the oxidizing agent, the fluorine-based compound, the surfactant represented by Chemical Formula 1, the water, and the monocarboxylic acid or the salt thereof.

8. The etchant composition of claim 1, wherein the fluorine-based compound comprises tetraalkylammonium fluoride.

9. The etchant composition of claim 1, wherein: the oxidizing agent comprises at least one of hydrogen peroxide, nitric acid, nitrate, nitrite, periodic acid, iodine salt, perchloric acid, and perchlorate.

10. The etchant composition of claim 1, wherein the etchant composition has an etching rate for silicon of 40 Å/min or more and less than 210 Å/min, the etchant composition has an etching rate ratio of silicon germanium to silicon of 1.3 or less, and the etchant composition has an etching rate for silicon oxide of 7 Å/min or less.

11. The etchant composition of claim 1, wherein a surface roughness of a silicon layer, measured after etching the silicon layer with the etchant composition for etching silicon and silicon germanium, is 1.5 nm or less.

12. A preparation method of a pattern comprising: forming a semiconductor device including a silicon layer and a silicon germanium layer; and etching the semiconductor device with the etchant composition of claim 1.

13. The etchant composition of claim 1, wherein the etchant composition consists essentially of the oxidizing agent, the fluorine-based compound, the surfactant represented by Chemical Formula 1, and the water.

14. The etchant composition of claim 1, wherein the etchant composition consists of the oxidizing agent, the fluorine-based compound, the surfactant represented by Chemical Formula 1, and the water.

15. An etchant composition for etching silicon and silicon germanium, the etchant composition comprising:
an oxidizing agent;
a fluorine-based compound;
water; and
a surfactant represented by Chemical Formula 2,

[Chemical Formula 2]

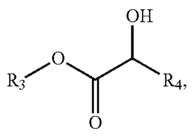

wherein the surfactant is contained in an amount of 5% to 40% by weight based on 100% by weight of the etchant composition,
wherein, in Chemical Formula 2,
$R_3$ is an alkyl group having 2 to 4 carbon atoms, and
$R_4$ is hydrogen or an alkyl group having 1 to 3 carbon atoms, wherein
a sum of contents of primary amine, secondary amine, and tertiary amine contained in the etchant composition is less than 0.001% by weight based on 100% by weight of the etchant composition.

16. The etchant composition of claim 15, further comprising:
a monocarboxylic acid or a salt thereof.

17. The etchant composition of claim 15, wherein the fluorine-based compound comprises tetraalkylammonium fluoride.

18. The etchant composition of claim 15, wherein: the oxidizing agent comprises at least one of hydrogen peroxide, nitric acid, nitrate, nitrite, periodic acid, iodine salt, perchloric acid, and perchlorate.

* * * * *